United States Patent [19]

Yoder

[11] 4,263,531
[45] Apr. 21, 1981

[54] ELECTRON BEAM-SEMICONDUCTOR DIODE HYBRID DEVICE FOR PHASE CONTROL

[76] Inventor: Max N. Yoder, 6512 Truman Lane, Falls Church, Va. 22043

[21] Appl. No.: 151,974

[22] Filed: Jun. 10, 1971

[51] Int. Cl.³ .............................................. H01J 29/08
[52] U.S. Cl. ........................................... 315/3; 332/25
[58] Field of Search ............................ 332/25, 7; 315/3

[56] References Cited

U.S. PATENT DOCUMENTS

| 2,600,373 | 6/1952 | Moore | 315/3 |
|---|---|---|---|
| 2,818,548 | 12/1957 | Kazan | 332/25 |
| 2,941,110 | 6/1960 | Yando | 315/3 |
| 3,020,438 | 2/1962 | Sziklai | 315/3 |
| 3,614,516 | 10/1971 | Phillips | 315/3.6 |

*Primary Examiner*—Malcolm F. Hubler
*Attorney, Agent, or Firm*—R. S. Sciascia; William T. Ellis

[57] ABSTRACT

Method and means for controlling the phase of an output signal comprising an electron beam device having traveling-wave-type deflection plates to which an input signal is fed, means controlling the velocity or position of the electron beam and p-n semiconductor diode means for amplifying the signal which modulates the electron beam which irradiates the diode, the phase of the output signal being related either to the velocity of the electron beam or its position on the semiconductor diode.

9 Claims, 5 Drawing Figures

ELECTRON BEAM-SEMICONDUCTOR DIODE HYBRID DEVICE FOR PHASE CONTROL

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to phase-control devices and methods and especially to electron-beam/semiconductor-diode means for independently controlling the phase of rf or microwave signals.

In the transmission of radar signals, antenna arrays are employed in which the phases of the signals radiated by the various antennas in the array are different so that a beam is formed in a certain direction. It would be desirable, also, to have a technique and means for varying the phases of the signals received by such an antenna array. A broadband antenna beam scanning technique does exist whereby, in theory, a compatible microwave receiver could be built. A strip transmission line whose conductors are separated by a ferroelectric dielectric is employed. The velocity of propagation along the transmission line is inversely proportional to the value of the dielectric constant of the insulator. A direct-current bias applied to this line, through the action of the ferroelectric coupling constants, changes the value of the dielectric constant and thereby varies the signal transit time. Unfortunately, the transmission velocity is varied. Another inherent limitation is the high loss tangent of the ferroelectric insulator which manifests itself in large signal attenuation.

BRIEF SUMMARY OF INVENTION

The present invention permits the phase of one or more signals to be varied as desired by modulating an electron beam with the input signal and irradiating a p-n semiconductor diode with the beam. The phase of the signal is controlled by passing the beam through an anode which controls the velocity of the electron beam or its position.

An object of this invention is to control the phase of an output signal as a function of the phase of the input signal.

Another object is to control the phase of the signal without impedance mismatches and large losses.

Another object is to control independently and simultaneously the phases of a plurality of signals without impedance mismatches and large losses.

Another object is to control the phase of a signal rapidly and with very small energy expenditure.

Other objects, advantages and novel features of the invention will become apparent from the following detailed description of the invention when considered in conjunction with the accompanying drawings wherein.

DETAILED DESCRIPTION OF THE INVENTION

Figure 1:
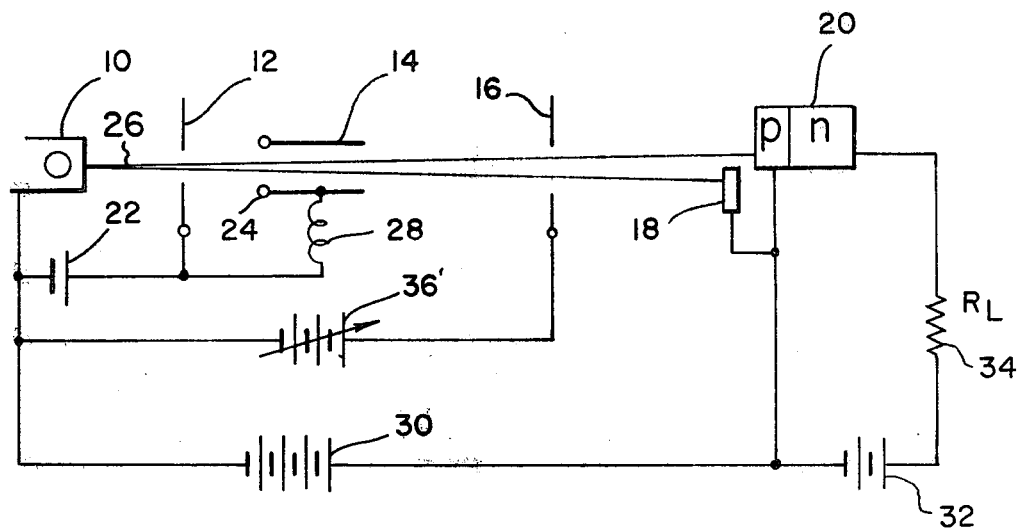
FIG. 1 is a schematic representation of an embodiment of the invention.

FIG. 1 shows an electron-beam device comprising a cathode 10, a hollow beam-forming anode 12, traveling-wave-type deflection plates 14, a second hollow anode, or beam-delay means, 16, a collector 18 and a p-n semiconductor diode 20.

The cathode 10 emits electrons which are accelerated and formed into a beam by beam-forming anode 12. Battery 22 supplies the accelerating potential for the beam-forming anode 12 and provides a uniform longitudinal field for the traveling-wave-type deflection plates 14. These deflection plates provide for a traveling-wave interaction between the input signal, which is fed in across points 24 of the deflection plates, and the electron beam 26, that is, the velocity of propagation of the signal along the plates is the same as the velocity of the electron beam along the axis of the electron-beam device. The plates 14 are isolated for ac by one or more inductors 28.

The rf or microwave signal which is fed to the cathode end of the traveling-wave-type deflection plates 14 modulates the electron beam, i.e., it deflects the beam between a metallic collector 18 and a back-biased p-n semiconductor amplifying device 20.

In the quiescent, or no-deflection-signal, state, the electron beam 26 impinges partially on the collector 18 and partially on the diode 20. Electron-hole pairs are created within the depletion region of the diode by the inpact ionization action of the electron beam, one electron-hole pair being created for every 3.6 electron volts of energy possessed by the ionizing electrons bombarding the depletion region. Thus, the potential supplied to the diode 20 by battery 30 controls the current gain of the diode 20. Because of the electric field across the depletion region of the diode 20 created by the bias supply 32, the electrons are swept to the cathode of the diode 20 and the holes to its anode, thus causing a nominal number of electrons to flow through the load resistor 34. The deflection of the beam caused by the input signal applied to the deflection plates causes a greater or lesser area of the diode to be covered by bombarding electrons. The output current is a multiple of the bombarding current and is directly proportional to the position of the electron beam since the current density of the beam is substantially uniform and current bombarding the diode is proportional to the bombarded area of the diode. Thus, class A operation results.

The delay means 16 acts as a post-deflection retardation and acceleration control means on the electron beam 26. By varying its potential by means of the variable dc bias supply 36, the velocity of the electron beam 26 can be varied independently of the transverse deflection rate of the beam, which is controlled solely by the input signal on the deflection plates 14. Thus, the variation of potential on the beam-delay means 16 conrols the delay experienced by the signal between the time it is applied to the deflection plates 14 and the time it is applied to the diode 20 and the load 34.

Figure 2:
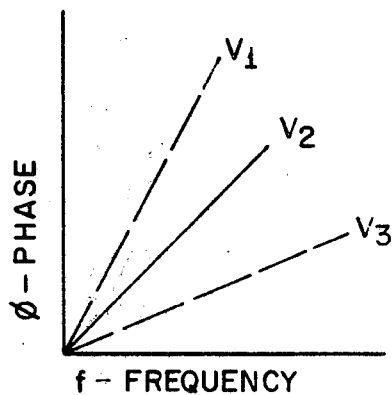
FIG. 2 is a graph showing the phase vs. frequency characteristic of the output signal.

Because signal phase is controlled by transit time variation, a phase $\phi$ versus frequency f relationship results (see FIG. 2) which is linear over multiple octaves of frequency. The potential on the delay means 16 determines the slope of this relationship, the lowest potential, $v_1$, resulting in the greatest scope and highest potential, $v_3$, in the smallest slope. However, all are linear relationships.

The electron beam 26 passes through the hole in the delay anode 16 without impinging thereon. Thus only a small amount of energy is required to change the potential of this anode and the potential, and therefore the signal transit time, can be varied very rapidly.

Figure 3:
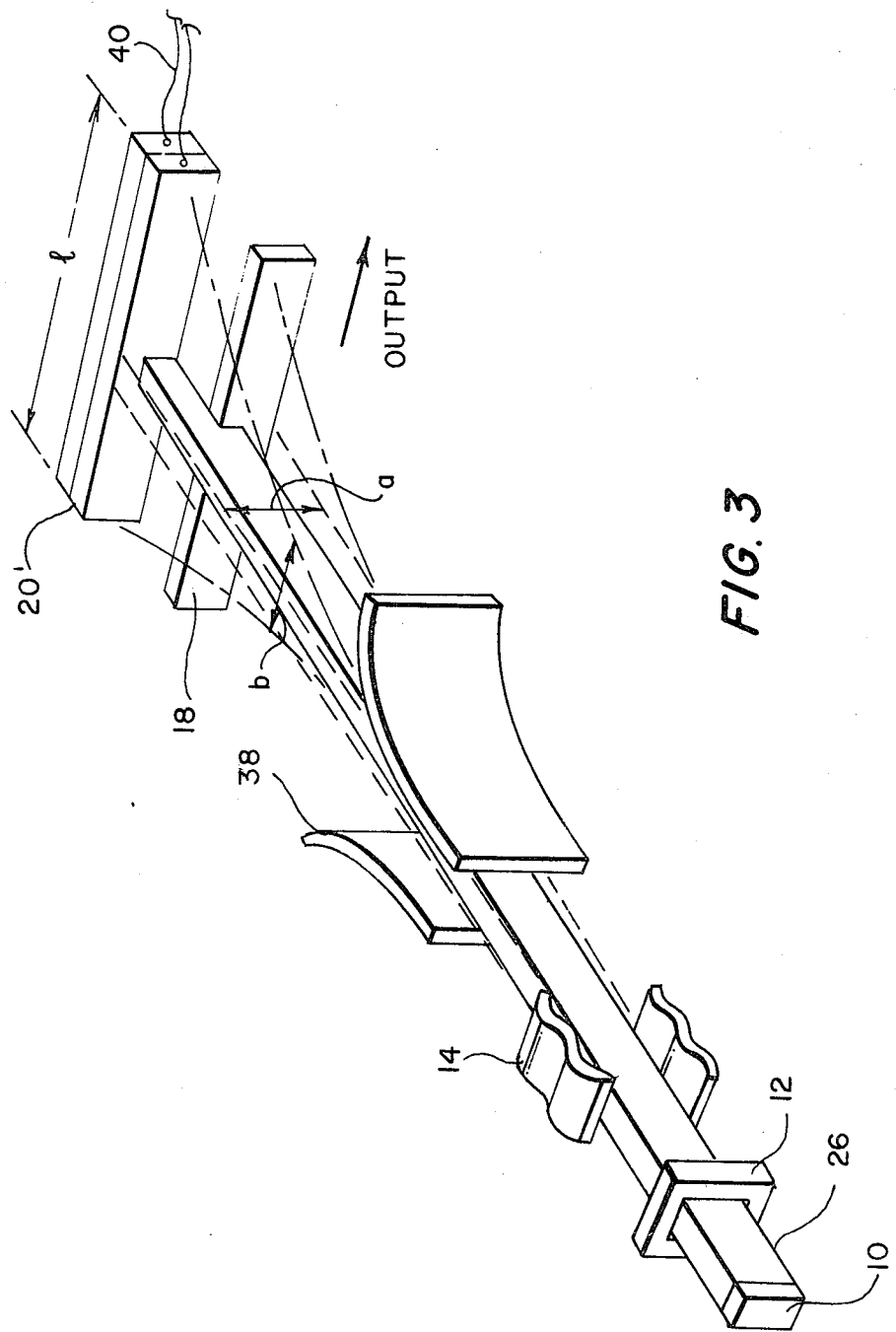
FIG. 3 is a schematic representation of a second embodiment of the invention.

A second scheme for obtaining a linear phase vs. frequency characteristic is shown in the embodiment of FIG. 3. Here beam-deflection plates 38 are used instead of the delay anode 16 of FIG. 1, the beam being deflected in the horizontal directions indicated by line b, and the limits of deflection being indicated by the broken lines. The dashed lines indicate the limits of vertical deflection of the beam along line a by the input signal fed to the traveling-wave-type deflection plates 14. A further change is the configuration of the p-n semiconductor diode 20' which is strip-line-configured here, the signal propagating along its length 1 in both diections. A resistor (not shown here) is placed across one end of the signal-propagation-path means, the strip-line configured diode 20', to dissipate the signal energy there and the opposite end is coupled to a transmission line 40. The signal energy is propagated along the diode strip line in a direction normal to both the longitudinal direction of the electron beam and the vertical transverse direction in which it is deflected. With no field between the deflecion plates 38, the electron beam impinges on the mid-point of the diode 20'. A nominal delay time, t, results between the signal input to the deflection plates 38 and signal output to the transmission line end of the diode. If a field is applied between the deflection plates 38, the electron beam is made to impinge along the diode strip line at a place other than the middle. If this new point is closer to the transmission line end, the delay is smaller-if farther from the transmission-line end, the delay is greater. Since signal phase is controlled by transit time variation along the diode strip, a phase vs. frequency relationship exists which is linear over multiple octaves of frequency. The transit-time control means (deflection plates 38) can also be made to operate in the traveling wave manner so as to reduce the power required to change signal transit time.

It should be noted that the collector 18 is also strip-configured, as might be expected.

The velocity control, or delay means 16 of FIG. 1 and the deflection plates 38 of FIG. 3 can both be considered to be signal-transit-time control means. The velocity control means 16 controls the signal transit time in the beam, that is, it controls the transit time of the signal between the time it is applied to the beam by the traveling-wave-type deflection plates and the time it affects the diode 20. The deflection plates 38, on the other hand, control the position of the beam and thereby control the transit time of the signal after it strikes the strip-line diode 20' that is, they control the transit time of the signal along the diode.

Figure 4:
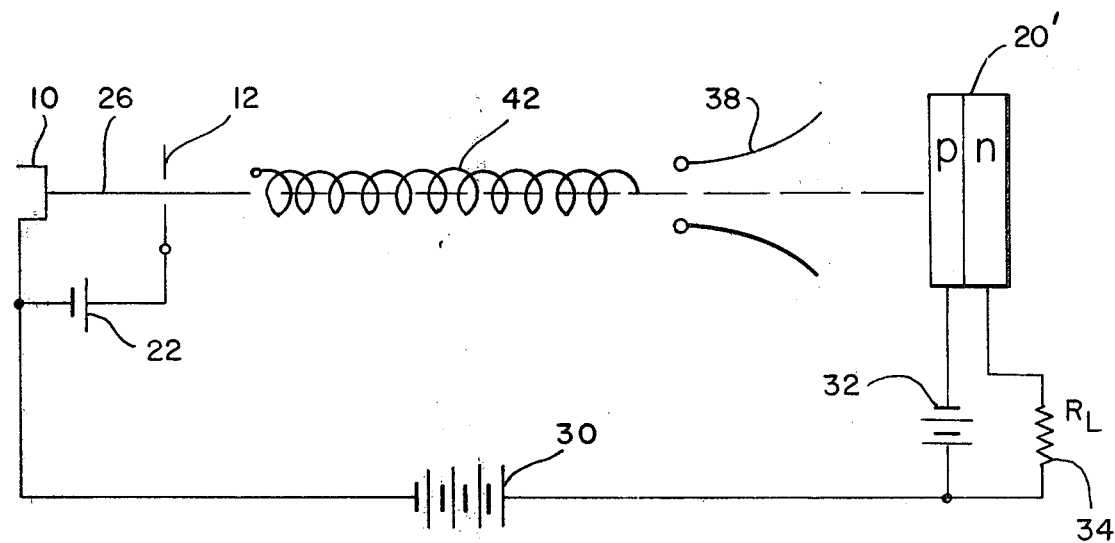
FIG. 4 is a schematic representation of a third embodiment of the invention.

Another embodiment of the invention is shown in FIG. 4. Here a helix 42 is used instead of traveling-wave-type deflection plates. The configuration is similar to that used in a traveling-wave tube (TWT) except that the second helix therein is not necessary. The helix 42 is connected to a potential (not shown) in such a manner that the electron velocity is synchronous with the electro-magnetic propagation velocity in the direction of the beam. A solenoid or arrangement of periodically spaced permanent magnets (not shown) focuses the electron beam as is done in a traveling-wave tube. (This is well-known procedure in the art.) An input signal applied to the cathode end of the helix 42 acts to density-modulate (bunch) the electrons so that their periodicity is proportional to the wavelength of the input signal in the same manner as in a TWT. The current-density function is amplified in the class A manner and the signal is extracted as it was in the embodiment of FIG. 3. The field across the deflection plates 38 causes the density-modulated electron beam to impinge closer or farther away from the load end of the stripline diode 20'. Signal transit time is thus varied so as to be independent of signal frequency, as before and a phase vs. frequency relationship results which is linear over the bandwidth of the helix traveling-wave structure.

Figure 5:
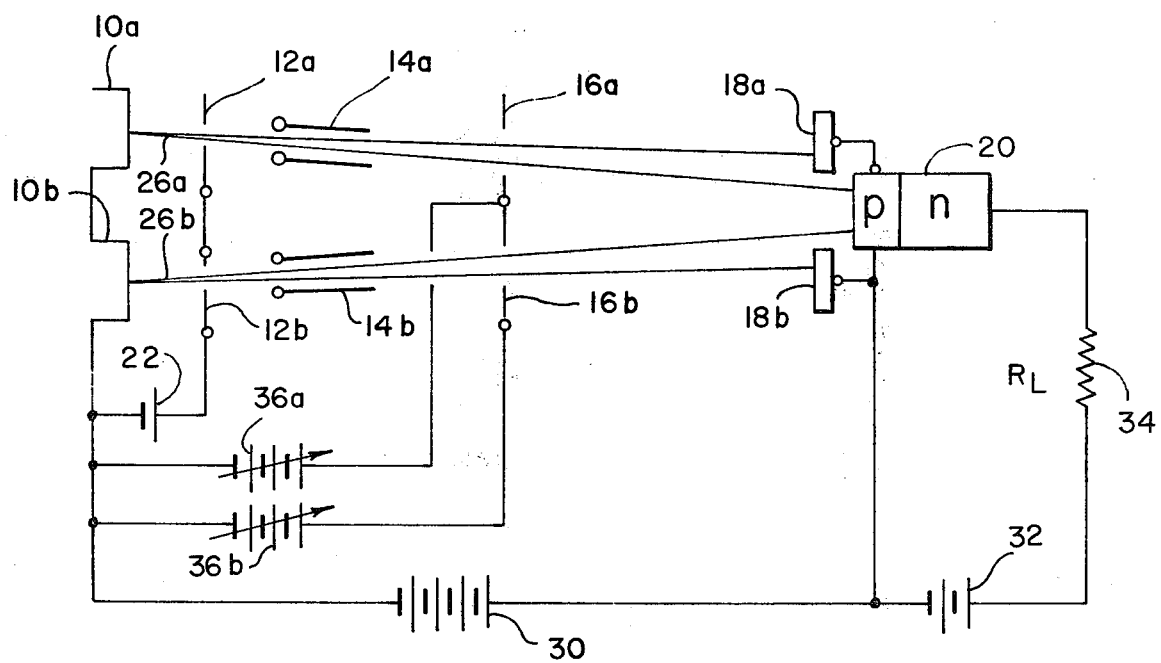
FIG. 5 is a schematic representation of an embodiment of the invention useful for controlling more than one input signal.

In FIG. 5, two separate electron guns are used, each operating in the same manner as the embodiment shown in FIG. 1. The delay means 16a and 16b are each connected to separate variable potential supplies 36a and 36b. With this embodiment, separate rf or microwave input signals can be applied to the traveling-wave-type deflection plates 14a and 14b and each signal can be independently controlled by its respective delay means 16a and 16b.

Thus, the amplifier has the capability of delivering two separate signals into a common load 34 in such a manner that each signal has an independently controlled phase vs. frequency characteristic. Although only two electron beams are shown impinging on a common diode 20, a multiple number of electron gun structures can be employed to control multiple input signals so that each signal is independent of the others in its phase vs. frequency relationship.

Since all aspects of signal amplification and adding are linear, inter-and cross-modulation products are negligible.

Multiple electron guns may also be used for the other embodiments of the invention disclosed herein.

Obviously many modifications and variations of the present invention are possible in light of the above teachings. It is therefore to be understood that within the scope of the appended claims the invention may be practiced otherwise than as specifically described.

I claim:

1. Apparatus to control the phase of an output signal relative to that of an input signal in a manner such that the phase vs. frequency relationship of the output signal is linear comprising, in combination:
    electron-beam generating means including
        beam-deflection means to which said input signal is applied for deflecting the electron beam in accordance with a parameter of said input signal, said deflection means being structured to cause a traveling-wave type of interaction between said beam and said input signal as it propagates along said beam-deflection means;
    signal-transit-time control means for controlling the transit time of said input signal whereby the phase of said output signal with respect to the input signal can be controlled; and
    means for deriving the phase-varied signal comprising p-n semiconductor junction means on which said electron beam impinges, said p-n junction means being arranged so that said beam impinges on the p-material before striking any other material of said junction means.

2. Apparatus as in claim 1, wherein said semiconductor means is an amplifying device.

3. Apparatus as in claim 1, further including collector means connected to the same potential supply as said semiconductor device, said collector means being positioned so that half of the electron beam impinges on said collector means and half on said semiconductor device when no signal input is applied to said beam-generating means, movements of said beam in response to variations in said input signal acting to cause greater or lesser areas of said beam to impinge on said semiconductor device while correspondingly lesser or greater areas of said beam impinge on said collector means.

4. Apparatus as in claim 1, wherein said signal-transit-time control means comprises anode means for accelerating or delaying the velocity of the electrons in said beam.

5. Apparatus as in claim 1, wherein said signal-transit-time control means comprises beam-deflection means for deflecting said beam so as to control its position, and signal-propagation-path means, said deflection means operating to control the initial position of said beam relative to said signal-propagation-path means whereby the time of transit of the signal along said path is controlled.

6. Apparatus as in claim 1, wherein said electron-beam-generating means includes a plurality of said beam-deflection means each being fed a different input signal, and an equal number of signal-transit-time control means, a different one for each beam-deflection means, whereby the phase of each input signal can be independently varied.

7. Apparatus as in claim 2, wherein said signal-transit-time control means comprises anode means for accelerating or delaying the velocity of the electrons in said beam.

8. Apparatus as in claim 2, wherein said signal-transit-time control means comprises beam-deflection means for deflecting said beam so as to control its position, and signal-propagation-path means, said deflection means operating to control the initial position of said beam relative to said signal-propagation-path means whereby the time of transit of the signal along said path is controlled.

9. Apparatus as in claim 2, wherein said electron-beam-generating means includes a plurality of said beam-deflection means, each being fed a different input signal, and an equal number of signal-transit-time control means, a different one for each beam-deflection means, whereby the phase of each input signal can be independently varied.

* * * * *